US011031158B2

(12) United States Patent
Pandey et al.

(10) Patent No.: US 11,031,158 B2
(45) Date of Patent: Jun. 8, 2021

(54) CONTINUOUSLY VARIABLE PRECISION AND LINEAR FLOATING RESISTOR USING METAL-OXIDE-SEMICONDUCTOR FIELD-EFFECT TRANSISTORS

(71) Applicant: INDIAN INSTITUTE OF TECHNOLOGY BOMBAY, Mumbai (IN)

(72) Inventors: Prem Chand Pandey, Mumbai (IN); Shibam Debbarma, Agartala (IN); Vikas Marla, Thane (IN); Nitya Tiwari, Indore (IN); Rani Holani, Indore (IN); Dinesh Kumar Sharma, Mumbai (IN)

(73) Assignee: INDIAN INSTITUTE OF TECHNOLOGY BOMBAY, Mumbai (IN)

( * ) Notice: Subject to any disclaimer, the term of this patent is extended or adjusted under 35 U.S.C. 154(b) by 0 days.

(21) Appl. No.: 16/757,648

(22) PCT Filed: Nov. 16, 2018

(86) PCT No.: PCT/IN2018/050760
§ 371 (c)(1),
(2) Date: Apr. 20, 2020

(87) PCT Pub. No.: WO2020/035873
PCT Pub. Date: Feb. 20, 2020

(65) Prior Publication Data
US 2020/0251260 A1    Aug. 6, 2020

(30) Foreign Application Priority Data

Aug. 13, 2018 (IN) .............................. 201821030404

(51) Int. Cl.
*H01C 7/10* (2006.01)
*H03K 17/687* (2006.01)
(Continued)

(52) U.S. Cl.
CPC ............... *H01C 7/10* (2013.01); *H03H 11/53* (2013.01); *H03H 11/54* (2013.01); *H03K 17/687* (2013.01)

(58) Field of Classification Search
CPC ........ H01C 7/10; H03K 17/687; H03H 11/54; H03H 11/53
See application file for complete search history.

(56) References Cited

U.S. PATENT DOCUMENTS

| 5,345,118 A | 9/1994 | White et al. |
| 7,049,875 B2 | 5/2006 | Tsividis |
| 2020/0358399 A1* | 11/2020 | Rokos .................... H03B 5/364 |

FOREIGN PATENT DOCUMENTS

GB    2270220 A    3/1994

OTHER PUBLICATIONS

International Search Report and Written Opinion issued in PCT/IN2018/050760, dated Jun. 3, 2019; ISA/US.

* cited by examiner

*Primary Examiner* — Jung Kim
(74) *Attorney, Agent, or Firm* — Harness, Dickey & Pierce, P.L.C.

(57) ABSTRACT

A circuit for realizing a precision and linear floating resistor, using MOSFET devices, is disclosed. A linear floating voltage-controlled resistor (LFVCR) is realized using a MOSFET with a gate drive means and a substrate drive means to provide a feedback of the common-mode voltage across the source-drain terminals to the gate and substrate terminals. Two such LFVCR circuits using matched MOSFET devices having independent substrates, along with an (Continued)

op-amp based negative feedback loop, are used to realize a continuously variable precision and linear floating resistor, whose value can be controlled by a combination of variable voltage, current, and resistor. Further embodiments are disclosed for realizing a resistor mirror circuit with multiple floating resistors, improving the linearity by using LFVCR circuits with complementary MOSFET devices, realizing a resistor with scaled-up resistance and extended voltage range, and realizing a resistor with scaled-down resistance and extended current range.

20 Claims, 10 Drawing Sheets

(51) Int. Cl.
    *H03H 11/54*     (2006.01)
    *H03H 11/46*     (2006.01)

CONTINUOUSLY VARIABLE PRECISION AND LINEAR FLOATING RESISTOR USING METAL-OXIDE-SEMICONDUCTOR FIELD-EFFECT TRANSISTORS

CROSS-REFERENCE TO RELATED APPLICATIONS

This application is a 371 U.S. National Phase of International Application No. PCT/IN2018/050760, filed Nov. 16, 2018, which claims priority to Indian Patent Application No. 201821030404, filed Aug. 13, 2018. The entire disclosures of the above applications are incorporated herein by reference.

TECHNICAL FIELD

The present disclosure relates to an electronic circuit for realizing a continuously variable resistor, whose value can be controlled by a voltage, a current, or a resistance, for analog signal processing applications, and more particularly to a precision and linear floating resistor using metal-oxide-semiconductor field-effect transistors.

BACKGROUND

Electronically controlled resistors have wide-ranging applications in analog signal processing. A digitally controlled resistor is realized as a circuit comprising several resistors and analog switches and is used in applications requiring resistance variation in discrete steps. In switched-capacitor (SC) circuits, a variable resistance is simulated using analog switches and capacitors and its value can be controlled by the clock frequency. Its usefulness is limited to audio and low-frequency applications and in certain circuit configurations. A continuously variable resistor is a much more versatile circuit for use in multipliers, modulators, demodulators, volume controllers, and tunable filters. Its resistance may be controlled by a voltage, a current, or a resistance.

The most common type of continuously variable resistor is the voltage-controlled resistor (VCR). For a linear VCR, the resistance does not change with the voltage across its terminals. Many applications require a precision VCR, for which the relationship between the control voltage and the controlled resistance should not be affected by temperature-related and process-dependent variation in the parameters of the devices used for realizing the resistor. In case of a grounded VCR, one of its two terminals is connected to the circuit ground. In case of a floating VCR, neither of its two terminals needs to be connected to the circuit ground and hence it is much more versatile. The current in a linear floating VCR is proportional to the differential voltage (difference of the two terminal voltages) and is not affected by the common-mode voltage (mean of the two terminal voltages). The current in a precision and linear floating VCR is proportional to the differential voltage and is not affected by the common-mode voltage and device parameters.

A grounded VCR can be realized by controlling the channel resistance of a junction field-effect transistor (JFET) or a metal-oxide-semiconductor field-effect transistor (MOSFET), also known as insulated gate field-effect transistor (IGFET), by varying the gate-source voltage. Such a VCR acts as a linear resistor for small values of the drain-source voltage, typically up to tens of mV. Further, the controlled resistance varies with the parameters of the device. There are several VCR circuits, using more than one JFET or MOSFET devices, that provide some of the features of precision, linear, and floating resistors, but not all simultaneously.

A circuit using a matched pair of JFET devices to realize a grounded resistor, in which the resistance is compensated against variations in the device parameters using an op-amp based negative feedback, was reported by Clarke (T. L. Clarke, "FET pair and op amp linearize voltage controlled resistor," Electronics, vol. 50, pp. 111-112, 1977). This circuit can be used as a linear resistor for small voltages only. A JFET-based floating resistor circuit, in which the linearity of the resistance is extended by adding the mean of the voltages at the drain and source terminals to the control voltage to obtain the gate voltage, was reported by Senani (R. Senani, "Realisation of linear voltage-controlled resistance in floating form," Electronics Letters, vol. 30, no. 23, pp. 1909-1911, 1994). As the resistance of this circuit is dependent on the device parameters, it cannot serve as a precision VCR. A floating resistor circuit using a matched pair of JFET devices, wherein the linearity of the resistance is extended by adding the average of the voltages at the drain and source terminals to the control voltage and the effect of variations in the device parameters is compensated by an op-amp based negative feedback loop, was reported by Holani et al. (R. Holani, P. C. Pandey, and N. Tiwari, "A JFET-based circuit for realizing a precision and linear floating voltage-controlled resistance," Proceedings of the 11th Annual Conference of the IEEE India Council (IEEE Indicon 2014), paper no. 1098, 2014).

A grounded resistor circuit using a parallel combination of a matched pair of MOSFET devices with independent substrates was reported, for extending the linearity of the resistance, by Moon et al. (G. Moon, M. E. Zaghloul, and R. W. Newcomb, "An enhancement-mode MOS voltage-controlled linear resistor with large dynamic range," IEEE Transactions on Circuits and Systems, vol. 37, no. 10, pp. 1284-1288, 1990). In this circuit, one device is diode connected to operate in the saturation region and has a series-connected bias source and the other device operates in the non-saturation region with the control voltage applied to its gate. This circuit and the other VCR circuits using a combination of MOSFET devices operating in the non-saturation and saturation regions for extending the linearity of the resistance do not realize a floating resistance and do not eliminate dependence of the resistance on the device parameters. MOSFET-based grounded resistor circuits with compensation in the gate voltage to reduce the resistance variation due to temperature variation have been described by Fort et al. (J. Fort and M. Cuenca, "Low variation resistor,", U.S. Pat. No. 8,054,156 B2, 2011) and by Fort (J. Fort, "MOS resistor with second or higher order compensation," U.S. Pat. No. 8,067,975 B2, 2011). These circuits do not eliminate the effect of process-dependent device parameters and do not extend the linearity of the resistor.

A floating resistor circuit using two matched p-channel devices, with their source and drain terminals connected in parallel and serving as the resistor terminals D and S, was reported by Banu et al. (M. Banu and Y. Tsividis, "Floating voltage controlled resistors in CMOS technology," Electronics Letters, vol. 18, no. 15, pp. 678-679, 1982). In this circuit, the substrate terminals are connected to the positive supply and the gate terminals are connected to the voltages $v_{G1}=v_C'+v_D$ and $v_{G2}=v_C'+v_S$, which are obtained from the input control voltage $v_C$ by using four matched n-channel devices. There is no compensation for the body effect in this circuit. An improved resistor circuit, in which the two matched MOSFET devices have independent substrates driven by $v_{B1}=V_{BB}+v_D$ and $v_{B2}=V_{BB}+v_S$ to compensate for the body effect, was described by White et al. (B. White and M. Negahban-Hagh, "Precision MOS resistor,", No. U.S. Pat. No. 5,345,118 A, 1994). A floating circuit with four matched n-channel MOSFET devices in saturation mode and four current mirrors was reported by Singh et al. (S. P. Singh, J. V. Hanson, and J. Vlach, "A new floating resistor for CMOS technology," IEEE Transactions on Circuits and Systems, vol. 36, no. 9, pp. 1217-1220, 1989). In this circuit, linearity depends on matching of the current mirrors, the range for variation of the control voltage is narrow, and there is no compensation for the body effect and the device parameter variations. A circuit for scaling up the resistance and voltage range of operation of a MOSFET-based grounded resistor, using an op amp with a bipolar junction transistor as the output current booster in the voltage follower mode and an attenuator formed by two resistors, was described by Bret et al. (G. Bret, "Circuit with a voltage-controlled resistance,", U.S. Pat. No. 5,300,834 A, 1994). Use of the bipolar junction transistor limits the use of this circuit to unipolar signals. Further, there is no compensation for the device parameter variations.

A MOSFET-based grounded resistor circuit, wherein the control voltage is applied to the gate and the input voltage with a process-dependent scaling factor is added to the substrate bias for linearizing the resistance, was reported by Patterson et al. (W. R. Patterson and F. S. Shoucair, "Harmonic suppression in unbalanced analog MOSFET circuit topologies using body signals," Electronics Letters, vol. 25, no. 25, pp. 1737-1739, 1989). A floating resistor circuit using a MOSFET with the gate and body having two terminals each, one near the source and the other near the drain was described by Tsividis (Y. Tsividis, "Linear voltage-controlled resistance element,", U.S. Pat. No. 5,293,058 A, 1994). In this circuit, the source and drain voltages are added to the control voltage to drive the corresponding ends of the gate and they are similarly added to the substrate bias to drive the corresponding ends of the substrate, resulting in constant gate-channel and body-channel voltages across the length of the channel for extending the linearity of the resistance. There is no compensation for the device parameter variations in this circuit.

A grounded resistor circuit with an op amp, two current sources, and matched MOSFET devices to realize a precision resistor mirror with the slave resistors tracking a master resistor was described by Liu et al. (J. Liu, K. Hwang, C. Chuang, and C. Fan, "Resistance mirror circuit,", U.S. Pat. No. 6,747,508 B2, 2004). This circuit is usable for small unipolar voltages. Another circuit with similar features and limitations was described by Fiedler (A. S. Fiedler, "Resistor mirror,", U.S. Pat. No. 6,788,100 B2, 2004). A MOSFET-based floating resistor circuit with the gate voltage generated by sensing the voltages at the source and drain terminals and using trans-linear current mode circuits was reported by Wee et al. (K. H. Wee and R. Sarpeshkar, "An electronically tunable linear or nonlinear MOS resistor," IEEE Transactions on Circuits and Systems, vol. 55, no. 9, pp. 2573-2583, 2008). This circuit can be used for realizing a given I-V characteristic, but the resistance has a dependence on the device parameters.

A circuit comprising a number of floating VCR cells, each formed by a floating-gate MOSFET with a biasing capacitor connected between the gate and source and a controller with switches to maintain a steady charge on the biasing capacitor corresponding to the control voltage, was described by Mariani (G. Mariani, "High linearity, low power voltage controlled resistor,", U.S. Pat. No. 6,504,416 B1, 2003). This circuit does not provide compensation for the body effect and device parameter variations. It is useful only for unipolar voltages as the source and drain terminals are not interchangeable. A floating resistor circuit using capacitive coupling and the charge storage properties of a floating-gate MOSFET was reported by Özalevli et al. (E. Özalevli and P. E. Hasler, "Tunable highly linear floating-gate CMOS resistor using common-mode linearization technique," IEEE Transactions on Circuits and Systems, vol. 55, no. 4, pp. 999-1010, 2008). This circuit does not provide compensation for device parameter variations. A resistor circuit using a matched pair of p-channel MOSFET devices, a reference current source, and an op-amp based feedback circuit for generating the gate voltages was described by Ito (K. Ito, "Resistor circuit,", U.S. Pat. No. 7,659,765 B2, 2010). In this circuit, one of the devices serves as the reference resistor and the other one as the variable resistor. The reference current passes through the first device (reference resistor) and its gate voltage is controlled such that its source-drain voltage equals a reference voltage. Half of the reference voltage is subtracted from the gate control voltage of the first device to generate the gate control voltage of the second device (variable resistor). Use of the feedback loop compensates against device parameter variations, but the variable resistor can be used as a linear floating resistor for small voltages only.

The VCR circuits based on JFET devices are not suitable for use in integrated circuit (IC) chips because of shifting of the IC design and fabrication activities from bipolar technology to CMOS technology. In the widely used CMOS processes, depletion-mode devices are generally not available and hence circuits based on the enhancement-mode devices are preferred for use in ICs. Thus, there is a need for a circuit using enhancement-mode MOSFET devices to provide continuously variable precision and linear floating resistor for use as a circuit for analog and mixed signal processing applications. The usefulness of such a circuit can be extended further by providing the control through a combination of voltage, current, or resistance.

SUMMARY

A circuit for realizing a precision and linear floating resistor using MOSFET devices, whose value can be continuously controlled by a voltage, a current, or a resistance, for use in analog signal processing applications, is disclosed.

A linear floating voltage-controlled resistor (LFVCR) is realized using a MOSFET with a gate drive means and a substrate drive means to provide a feedback of the common-mode voltage (average of the source and drain terminal voltages) to the gate and substrate terminals, respectively. The gate voltage is obtained by addition of the common-mode voltage to a control voltage and the substrate voltage is obtained by addition of the common-mode voltage to a bias voltage. In an embodiment, a circuit of a continuously variable precision and linear floating resistor comprising two such LFVCR circuits with a first LFVCR circuit and a second LFVCR circuit, is realized using matched MOSFET devices with independent substrates. The first LFVCR circuit is used to realize a resistor with the resistance controlled by voltage sources and placed in the negative feedback loop of an op amp such that the op-amp output provides the control voltage and compensates the resistance of the circuit against the device parameter variations, resulting in a precision resistor. The control voltage and the bias voltage of the second LFVCR circuit are the same as the corresponding voltages of the first LFVCR circuit. The second LFVCR circuit realizes a floating resistor that tracks the resistance of the first LFVCR circuit, resulting in a continuously variable precision and linear floating resistor. A realization of the preferred embodiment using op amps and resistors is also given. In variants of the circuit, the resistance is controlled by a combination of variable voltage, current, and resistor. In another embodiment, additional LFVCR circuits are used for realizing a resistor mirror with multiple floating resistors with a common set of controls.

In another embodiment, a circuit is disclosed for improving the linearity of the resistance. The circuit uses a first pair of LFVCR circuits realized using n-channel MOSFET devices, a second pair of LFVCR circuits realized using p-channel MOSFET devices, two op amps, and complementary set of controls and bias voltages. The LFVCR circuits similar to the first embodiment are used and can be realized using op amps and resistors.

Further embodiments are disclosed for realizing a resistor with scaled-up resistance and extended voltage range and for realizing a resistor with scaled-down resistance and extended current range.

BRIEF DESCRIPTION OF THE DRAWINGS

The detailed description is described with reference to the accompanying figures.

DETAILED DESCRIPTION OF THE INVENTION

The MOSFET has four terminals: source, drain, gate, and substrate (also known as body or bulk). It is used as a VCR with the resistance of the channel between the source and drain terminals controlled by the voltage at the gate terminal, with the substrate terminal connected to a voltage to maintain a reverse bias across the substrate-channel junction. The source and drain terminals are interchangeable. For an n-channel MOSFET, the terminal at higher potential is the drain and the other one is the source. For VCR application, the MOSFET is operated in the non-saturation region, which is also known as the triode or linear region. For the non-saturation region, the gate-channel voltage must be higher than the threshold voltage at the source as well as the drain ends of the channel.

For a linear floating VCR, the current should be proportional to the differential voltage across the resistor terminals and should not be affected by the common-mode voltage. For a precision VCR, the resistance should be deterministically related to the control voltage and not be affected by the temperature-related and process-dependent parameters of the device.

Figure 1:
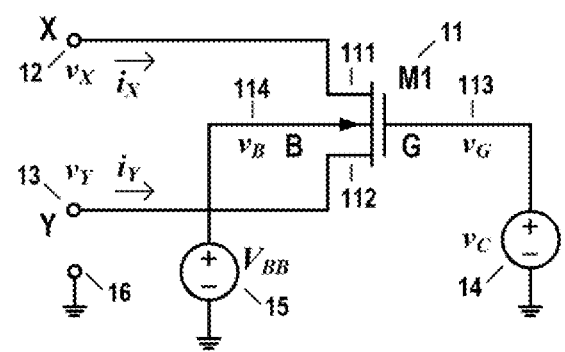
FIG. 1 illustrates a floating VCR circuit using a single n-channel MOSFET.

FIG. 1 illustrates a VCR circuit comprising a single n-channel enhancement-mode MOSFET. The circuit comprises a MOSFET (11), two resistor terminals (12, 13), a control voltage source (14), a bias voltage source (15), and a ground terminal (16). The MOSFET 11 (M1) has two interchangeable source-drain terminals (111, 112), a gate terminal (113), and a substrate terminal (114). The interchangeable source-drain terminals 111 and 112 of the MOSFET M1 are connected as the resistor terminals 12 and 13, respectively. The gate terminal 113 is connected to the control voltage source 14 ($v_C$) and the substrate terminal 114 is connected to the bias voltage source 15 ($V_{BB}$). The resistor terminals 12 and 13 are labeled as X and Y, respectively. The gate and substrate terminals of the MOSFET M1 are labeled as G and B, respectively. The voltages at X, Y, G, and B terminals with respect to the ground terminal are $v_X$, $v_Y$, $V_G$, and $v_B$, respectively. In this circuit, $v_G=v_C$ and $v_B=V_{BB}$. The voltage $v_B$ is applied to keep the substrate-channel junction of the MOSFET M1 reverse biased for the applicable values of the voltages $v_X$ and $v_Y$. The currents flowing into the X and Y terminals are labeled as $i_X$ and $i_Y$, respectively. During normal operation of the circuit, $i_Y=-i_X$ and no current flows into the gate and substrate terminals. The circuit can also be realized using a p-channel enhancement-mode, an n-channel depletion mode, or a p-channel depletion mode MOSFET, with appropriately applied $V_{BB}$ and $v_C$.

Operation of the circuit of FIG. 1 is analyzed using a device model based on the symmetry of the MOSFET between the source and drain terminals (H. Wallinga and K. Bult, "Design and analysis of CMOS analog signal processing circuits by means of a graphical MOST model," IEEE Journal of Solid-State Circuits, 24(3), pp 672-680, 1989; M. Ismail and T. Fiez, Analog VLSI Signal and Information Processing, McGraw-Hill, 1994, pp 16-20). For the MOSFET operation in the non-saturation region and strong inversion of the channel, the current $i_X$ is given as a difference of two quadratic expressions as the following:

$$i_X=[k/(2\alpha)][(v_G-v_B-V_{T0}-\alpha(v_Y-v_B))^2-(v_G-v_B-V_{T0}-\alpha(v_X-v_B))^2] \quad (1)$$

where k is a device-dependent parameter ($k=\mu C_{ox}W/L$, $\mu$=carrier mobility, W=channel width, L=channel length, $C_{ox}$=gate-channel capacitance per unit area), $V_{T0}$ is the threshold voltage without considering the body effect, and $\alpha$ is a process dependent parameter (typically 1.05-1.35) representing the body effect as a change in the threshold voltage due to the substrate bias.

For operation of the MOSFET in the non-saturation region, the gate-channel voltage must be supra-threshold at the source as well as the drain ends, which can be written as the following two conditions:

$$v_G - v_X \geq V_{T0} + (\alpha - 1)(v_X - v_B) \qquad (2)$$

$$v_G - v_Y \geq V_{T0} + (\alpha - 1)(v_Y - v_B) \qquad (3)$$

The second term on the right side in the above two relations represents the shift in the threshold due to the channel-substrate voltage at the two ends of the channel. The expression for the current $i_X$ as given in Equation 1 can be rewritten as $$i_X = k[v_G - v_B - V_{T0} - \alpha((v_X + v_Y)/2 - v_B)](v_X - v_Y) \qquad (4)$$

The resistance between the X and Y terminals is given as $$R_{XY} = (v_X - v_Y)/i_X \qquad (5)$$

It can be given, using Equation 4, as $$R_{XY} = [k(v_G - v_B - V_{T0} - \alpha((v_X + v_Y)/2 - v_B))]^{-1} \qquad (6)$$

Thus, the circuit serves as a floating VCR and the resistance can be controlled by varying the gate voltage $v_G$. As the resistance also depends on the common-mode voltage $(v_X + v_Y)/2$, the circuit does not serve as a linear resistor. It does not serve as a precision resistor either because the resistance depends on the temperature-related and process-dependent parameters (k, $V_{T0}$, $\alpha$) of the device.

The expression for the current $i_X$ in Equation 4 can be rewritten as $$i_X = k[v_G - (v_X + v_Y)/2 - V_{T0} + (\alpha - 1)(v_B - (v_X + v_Y)/2)](v_X - v_Y) \qquad (7)$$

The dependence of $i_X$ on the common-mode voltage can be eliminated by obtaining the gate voltage $v_G$ and the substrate voltage $v_B$ from the control voltage $v_C$ and the bias voltage $V_{BB}$ as the following:

$$v_G = v_C + (v_X + v_Y)/2 \qquad (8)$$

$$v_B = V_{BB} + (v_X + v_Y)/2 \qquad (9)$$

These voltages correspond to providing a feedback of the common-voltage across the interchangeable source-drain terminals of the MOSFET to its gate and substrate terminals. With these voltages, $i_X$ as given in Equation 7 can be expressed as $$i_X = k(v_C - V_{T0} + (\alpha - 1)V_{BB})(v_X - v_Y) \qquad (10)$$

Using Equations 5 and 10, the resistance $R_{XY}$ can be given as $$R_{XY} = [k(v_C - V_{T0} + (\alpha - 1)V_{BB})]^{-1} \qquad (11)$$

The above equation shows that the addition of the common-mode voltage to the control voltage $v_C$ and to the bias voltage $V_{BB}$ to get the gate voltage $v_G$ and the substrate voltage $v_B$, respectively, results in a linear floating resistor and the resistance can be controlled by $v_C$. However, the resistance depends on the device parameters and hence it is not a precision resistor.

The conditions for non-saturation region of operation as given in Equations 2 and 3, using expressions for $V_G$ and $V_B$ as given in Equations 8 and 9, can be combined to obtain the limit on the differential voltage as $$|v_X - v_Y| \leq (2/\alpha)[v_C - (V_{T0} - (\alpha - 1)V_{BB})] \qquad (12)$$

For maintaining a reverse bias across the substrate-channel junction, we should have $v_X \geq v_B$ and $v_Y \geq v_B$, which can be written as the following two conditions:

$$v_X \geq V_{BB} + (v_X + v_Y)/2 \qquad (13)$$

$$v_Y \geq V_{BB} + (v_X + v_Y)/2 \qquad (14)$$

which can be rewritten as $v_X - v_Y \geq 2V_{BB}$ and $v_Y - v_X \geq 2V_{BB}$. For an n-channel MOSFET, $V_{BB}$ is negative. Therefore, the limit on the differential voltage can be expressed as $$|v_X - v_Y| \leq -2V_{BB} \qquad (15)$$

The limits as given by Equations 12 and 15 can be combined to obtain the limit on the differential voltage as $$|v_X - v_Y| \leq \min[(2/\alpha)(v_C - (V_{T0} - (\alpha - 1)V_{BB}), -2V_{BB}] \qquad (16)$$

There are no constraints on the common-mode voltage, other than the limit on the output of the adders used for obtaining $v_G$ and $v_B$.

It may be noted that the channel resistance of a MOSFET with the gate and substrate voltages as obtained in Equations 8 and 9 may exhibit some nonlinearity due to asymmetries in the source-drain channel, channel-length modulation effect (not considered in the model used for the analysis), and deviation from the assumption of strong channel inversion.

Figure 2:
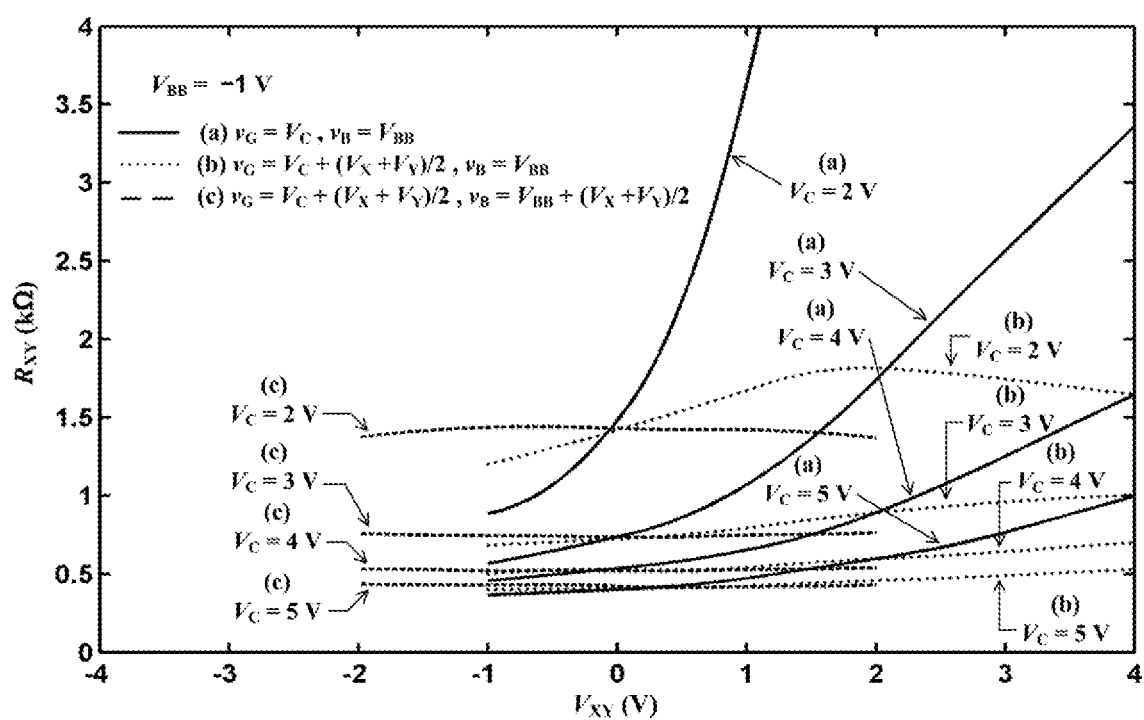
FIG. 2 shows a graph of the resistance of an n-channel MOSFET used as VCR, under different types of gate and substrate voltages.

FIG. 2 shows a graph of the resistance of an n-channel MOSFET used as VCR, under different types of gate and substrate voltages. The values in the graph are results of the measurements using a device on the chip ALD1106 having four n-channel devices. In this figure, the resistance is plotted as a function of the differential voltage and for a set of common-mode voltages and control voltages, with $v_Y = 0$. The measurements were made using dc voltages as $v_C$ and $v_X$, and these voltages are referred to as $V_C$ and $V_X$, respectively. The plots are shown for three conditions: (a) $v_G = V_C$, $v_B = V_{BB}$ (gate and substrate voltages without addition of the common-mode voltage), (b) $v_G = V_C + (V_X + V_Y)/2$, $v_B = V_{BB}$ (addition of the common-mode voltage only for the gate voltage), and (c) $v_G = V_C + (V_X + V_Y)/2$, $v_B = V_{BB} + (V_X + V_Y)/2$ (addition of the common-mode voltage for the gate and substrate voltages). The plots show that the resistance $R_{XY}$ has a large variation under the condition 'a' with the gate and substrate voltages applied without the addition of the common-mode voltage. This variation decreases under the condition 'b' with the gate voltage obtained by addition of the common-mode voltage. Under condition 'c' with the addition of the common-mode voltage for both the gate and substrate voltages, the resistance is constant for both polarities of the differential voltage and it is independent of the common-mode voltage. It may be noted that the stability of the resistance improves with an increase in the control voltage, indicating that linearization of the channel resistance improves under strong inversion.

Figure 3:
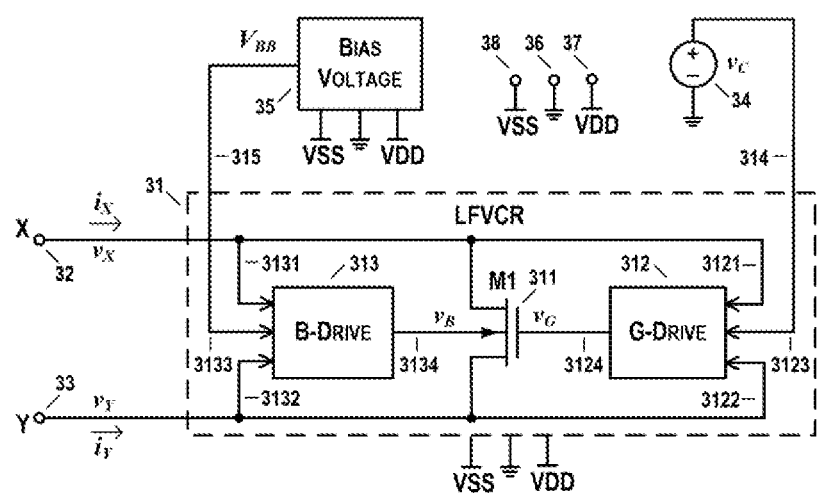
FIG. 3 illustrates a schematic of the linear floating VCR (LFVCR) circuit using a single n-channel MOSFET.

The theoretical analysis and practical verification as presented above show that addition of the common-mode voltage to the control voltage to obtain the gate voltage and addition of the common-mode voltage to the bias voltage to obtain the substrate voltage could be used for realizing a linear floating VCR (LFVCR) circuit. FIG. 3 illustrates a schematic of such a circuit using an enhancement-mode n-channel MOSFET. The circuit comprises an LFVCR circuit (31), a voltage source (34), a bias voltage means (35), a ground terminal (36), and two supply voltage terminals (37, 38). The LFVCR circuit 31 comprises an n-channel MOSFET (311), a gate drive means (312), a substrate drive means (313), a control terminal (314), a bias terminal (315), and two resistor terminals (32, 33), The higher supply voltage terminal 37 is labeled as VDD and the lower supply voltage terminal 38 is labeled as VSS. One of the two supply voltage terminals may be the same as the ground terminal. The gate drive means 312, the substrate drive means 313, and the bias voltage means 35 are powered by connections to the ground, VDD, and VSS terminals. The voltage source 34 provides a control voltage $v_C$, and voltage source 34 is connected to the control terminal 314 of the LFVCR 31. The output of the bias voltage means 35 provides a bias voltage $V_{BB}$, and is connected to the bias terminal 315 of the LFVCR 31. The resistor terminals 32 and 33 are labeled as X and Y, respectively. The voltages at X and Y terminals with respect to the ground terminal are $v_X$ and $v_Y$, respectively. The gate drive means 312 (G-Drive) has three input terminals (3121, 3122, 3123) and an output terminal (3124), with the input terminals 3121, 3122, and 3123 connected to the terminals 32, 33, and 314, respectively, and the output terminal 3124 connected to the gate of the MOSFET 311 (M1). The substrate drive means 313 (B-Drive) has three input terminals (3131, 3132, 3133) and an output terminal (3134), with the input terminals 3131, 3132, and 3133 connected to the terminals 32, 33, and 315, respectively, and the output terminal 3134 connected to the substrate of the MOSFET 311.

In the circuit of FIG. 3, the G-Drive means receives the inputs $v_X$, $v_Y$, and $v_C$, adds the common-mode voltage (average of the terminal voltages $v_X$ and $v_Y$) to the control voltage $v_C$ in accordance with Equation 8, and outputs the gate voltage $v_G=v_C+(v_X+v_Y)/2$. The B-Drive means receives the inputs $v_X$, $v_Y$, and $V_{BB}$, adds the common-mode voltage to the bias voltage $V_{BB}$ in accordance with Equation 9, and outputs the substrate voltage $v_B=V_{BB}+(v_X+v_Y)/2$. The G-drive, B-Drive, and bias voltage means may be realized using resistors and op amps or MOSFETs as part of an IC chip. The resistance of the LFVCR circuit is as given by Equation 11 and limits on the differential voltage are as given by Equation 16. The resistance of this circuit depends on the device parameters and hence it is not a precision resistor. A circuit similar to that illustrated in FIG. 3 can be realized using a p-channel MOSFET, with corresponding changes in the substrate and control voltages.

To realize a precision and linear floating VCR, the control voltage for the LFVCR circuit as shown in FIG. 3 should compensate for the variation in the device parameters. This is achieved in the present disclosure by using two LFVCR circuits with a common control voltage and using the MOSFET devices having the same device parameters and independent substrates. The first LFVCR circuit, is used as part of a negative feedback loop formed using an op amp with the op-amp output generating the control voltage to maintain the resistance at a reference value by compensating for variation in the device parameters. The second LFVCR circuit is used to realize the floating resistor. Two MOSFET devices with the same device parameters are known as a matched pair and are preferably fabricated with the same dimensions on a single chip so that temperature-related and process-dependent variations in the parameters are the same for the two devices. Standard CMOS process can be used for fabrication of ICs having p-channel devices with independent substrates. Triple-well CMOS process can be used for fabrication of ICs having either n-channel or p-channel devices with independent substrates.

Figure 4:
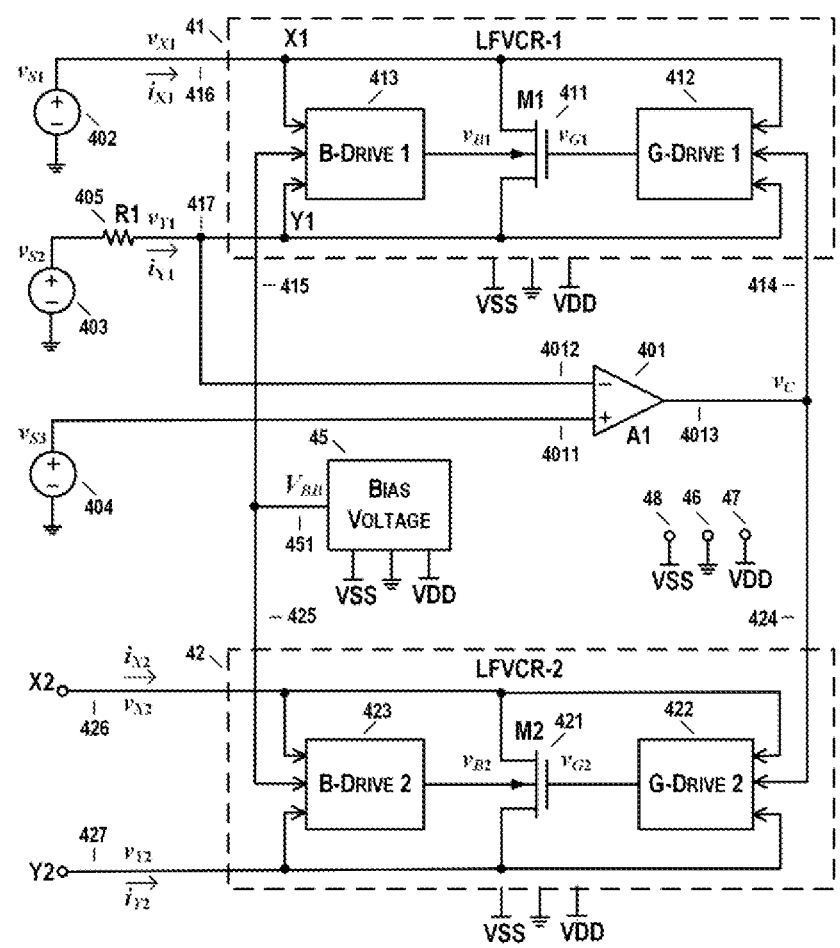
FIG. 4 illustrates a schematic for realizing a precision and linear floating resistor circuit using a matched pair of n-channel MOSFET devices, with the resistance controlled by a combination of three voltages and a resistance, in accordance with a preferred embodiment of the present disclosure.

Referring to FIG. 4, illustrated is a schematic of a circuit for realizing a precision and linear floating resistor, in accordance with a preferred embodiment of the present disclosure. The circuit comprises a first LFVCR circuit (41), a second LFVCR circuit (42), a bias voltage means (45), an op amp (401), three voltage sources (402, 403, 404), a resistor (405), a ground terminal (46), and two supply voltage terminals (47, 48). The LFVCR circuits 41 and 42 are of the same type as the LFVCR circuit 31 of FIG. 3. The first LFVCR circuit 41 (LFVCR-1) comprises a MOSFET (411), a gate drive means (412), a substrate drive means (413), a control terminal (414), a bias terminal (415), and two resistor terminals (416, 417). The second LFVCR circuit 42 (LFVCR-2) comprises a MOSFET (421), a gate drive means (422), a substrate drive means (423), a control terminal (424), a bias terminal (425), and two resistor terminals (426, 427). The precision and linear floating resistor is realized across the resistor terminals 426 (X2) and 427 (Y2) of the LFVCR circuit 42. The op amp 401 (A1) has a noninverting input terminal (4011), an inverting input terminal (4012), an output terminal (4013), and two supply terminals. The first voltage source 402 ($v_{S2}$) is connected to the resistance terminal 416 (X1) of the LFVCR circuit 41. The second voltage source 403 ($v_{S2}$) is connected in series with the resistor 405 (R1) to the resistor terminal 417 (Y1) of the LFVCR circuit 41 and to the inverting input terminal 4012 of the op amp 401. The third voltage source 404 ($v_{S3}$) is connected to the noninverting input terminal 4011 of the op amp 401. The output terminal 4013 of the op amp 401 is connected to the control terminal 414 of the LFVCR circuit 41 and also to the control terminal 424 of the LFVCR circuit 42, for providing a control voltage ($v_C$) for both the LFVCR circuits. The output terminal 451 of the bias voltage means 45 is connected to the bias terminal 415 of the LFVCR circuit 41 and to the bias terminal 425 of the LFVCR circuit 42, for providing a bias voltage ($V_{BB}$) for both the LFVCR circuits. The two MOSFET devices 411 (M1) and 421 (M2) are a matched pair of devices with independent substrates and are operated in the non-saturation region by the gate drive means 412 (G-Drive 1) and 422 (G-Drive 2) and the substrate drive means 413 (B-Drive 1) and 423 (B-Drive 2). The two LFVCR circuits 41 and 42, the bias voltage means 45, and the op amp 401 are powered through connections to the ground terminal 46, the higher supply voltage terminal 47 (VDD), and the lower supply voltage terminal 48 (VSS). One of the two supply voltage terminals may be the same as the ground terminal. The power supply connections are not shown in the schematic.

In the circuit of FIG. 4, the circuit LFVCR-1 is connected in the feedback loop of the op amp A1. For this feedback to be negative, the voltage at the output of the op amp A1 and the voltage at its inverting input terminal should be in phase. This condition requires that the source-drain terminal of the MOSFET M1 connected to the inverting input terminal of the op amp A1 should be the source terminal. This condition is met by applying the control voltages such that $v_{S1}>v_{S3}>v_{S2}$.

As the voltage $v_{S1}$ is connected to the terminal X1, $v_{X1}=v_{S1}$. The voltages at the two input terminals of the op amp A1 are equal due to the negative feedback loop, resulting in $v_{Y1}=v_{S3}$. For the MOSFET M1, the gate voltage $v_{G1}$ and the substrate voltage $v_{B1}$ are generated by G-Drive 1 and B-Drive 1, respectively, as the following:

$$v_{G1}=v_C+(v_{S1}+v_{S3})/2 \qquad (17)$$

$$v_{B1}=V_{BB}+(v_{S1}+v_{S3})/2 \qquad (18)$$

For the MOSFET M2, the gate voltage $v_{G2}$ and the substrate voltage $v_{B2}$ are generated by G-Drive 2 and B-Drive 2, respectively, as the following:

$$v_{G2}=v_C+(v_{X2}+v_{Y2})/2 \qquad (19)$$

$$v_{B2}=V_{BB}+(v_{X2}+v_{Y2})/2 \qquad (19)$$

The current $i_{Y1}$ through the device M1 is given as $$i_{Y1}=(v_{S2}-v_{S3})/R_1 \qquad (21)$$

Therefore, the channel resistance of the MOSFET M1, which is the resistance appearing across the terminals X1 and Y1, is given as $$R_{X1Y1} = (v_{S1} - v_{S3})/(-i_{Y1}) \quad (22)$$

From Equations 21 and 22, we get $$R_{X1Y1} = [(v_{S1} - v_{S3})/(v_{S3} - v_{S2})]R_1 \quad (23)$$

This resistance is independent of the device parameters of the MOSFET M1.

In the circuit of FIG. 4, the two LFVCR circuits are provided with the same control voltage $v_C$ from the output of the op amp A1 and the same bias voltage $V_{BB}$ from the output of the voltage bias circuit. Let the parameters of MOSFET M1 used for LFVCR-1 be $k_1$, $V_{TO1}$, and $\alpha$ and those of the MOSFET M2 used for LFVCR-2 be $k_2$, $V_{TO2}$ and $\alpha$. The channel resistance of the MOSFET M1 in terms of its device parameters is given, in accordance with Equation 11, as $$R_{X1Y1} = [k_1(v_C - V_{TO1} + (\alpha-1)V_{BB})]^{-1} \quad (24)$$

Similarly, the channel resistance of the MOSFET M2 in terms of its device parameters is given, in accordance with Equation 11, as $$R_{X2Y2} = [k_2(v_C - V_{TO2} + (\alpha-1)V_{BB})]^{-1} \quad (25)$$

Using Equations 24 and 25, we can write $$R_{X2Y2}/R_{X1Y1} = [k_1(v_C - V_{TO1} + (\alpha-1)V_{BB})][k_2(v_C - V_{TO2} + (\alpha-1)V_{BB})]^{-1} \quad (26)$$

For matched pair of MOSFET devices, $k_2 = k_1$ and $V_{TO2} = V_{TO1}$ and we have $$R_{X2Y2} = R_{X1Y1} \quad (27)$$

The resistance $R_{X2Y2}$ across the terminals X2 and Y2 tracks the resistance $R_{X1Y1}$, as given by Equation 23. Hence, the resistance $R_{X2Y2}$ is given as $$R_{X2Y2} = [(v_{S1} - v_{S3})/(v_{S3} - v_{S2})]R_1 \quad (28)$$

It is seen that the resistance depends only on the voltages $v_{S1}$, $v_{S2}$, and $v_{S3}$ and the resistance $R_1$. It is independent of the differential and common mode voltages and the device parameters. Thus, the preferred embodiment of the circuit shown in FIG. 4 realizes a precision and linear floating resistor, whose value can be controlled by a combination of three voltages and a resistance.

The precision of the resistance $R_{X2Y2}$ in the circuit of FIG. 4 may be affected by mismatch in the parameters of the MOSFET devices M1 and M2. For devices on the same chip, we expect the temperature-related and process-dependent parameters to be matched. However, some mismatch may occur due to location related differences and dimension related tolerances. Considering the parameters of the MOSFET M1 as the reference, the mismatch in the parameters are given as $V_{TO2} = V_{TO1} + \Delta V_T$ and $k_2 = k_1(1+\delta)$. Let the relative error in the resistance $R_{X2Y2}$ with respect to the resistance $R_{X1Y1}$ be expressed as $R_{X2Y2} = R_{X1Y1}(1+\varepsilon)$. With these terms, Equation 26 can be re-written as the following:

$$1 + \varepsilon = (1+\delta)^{-1}[v_C - V_{TO1} + (\alpha-1)V_{BB} - \Delta V_T]^{-1}[v_C - V_{TO1} + (\alpha-1)V_{BB}] \quad (29)$$

The above equation can be simplified, ignoring the second-degree terms, as the following:

$$\varepsilon = -\delta + \Delta V_T/[v_C - V_{TO1} + (\alpha-1)V_{BB}] \quad (30)$$

The maximum relative error is given as $$|\varepsilon| \approx |\delta| + |\Delta V_T|/[v_C - V_{TO1} + (\alpha-1)V_{BB}] \quad (31)$$

The above equation shows that the maximum relative error increases as $v_C$ decreases, i.e. the precision degrades for realizing a higher resistance value. A measurement of the device parameters on a set of 5 quad n-channel MOSFET ICs ALD1106 showed the mean values as k=0.66 mA/V$^2$, $|\delta|$=0.018, $V_{TO}$=0.56 V, and $|\Delta V_T|$=0.015 V. These values with $v_C$=5 V correspond to the maximum relative error in $R_{X2Y2}$ of approximately 2%.

For realizing a precision and linear floating VCR, the voltage $v_{S3}$ can be set as zero by connecting the noninverting input of the op amp A1 to the ground. The resistance of the circuit under these conditions is $R_{X2Y2} = [v_{S1}/(-v_{S2})]R_1$. With a constant $R_1$, the resulting resistance is proportional to $v_{S1}$ and inversely proportional to $-v_{S2}$. Alternatively, the resistance $R_{X2Y2}$ can be controlled by varying the resistance $R_1$.

Figure 5:
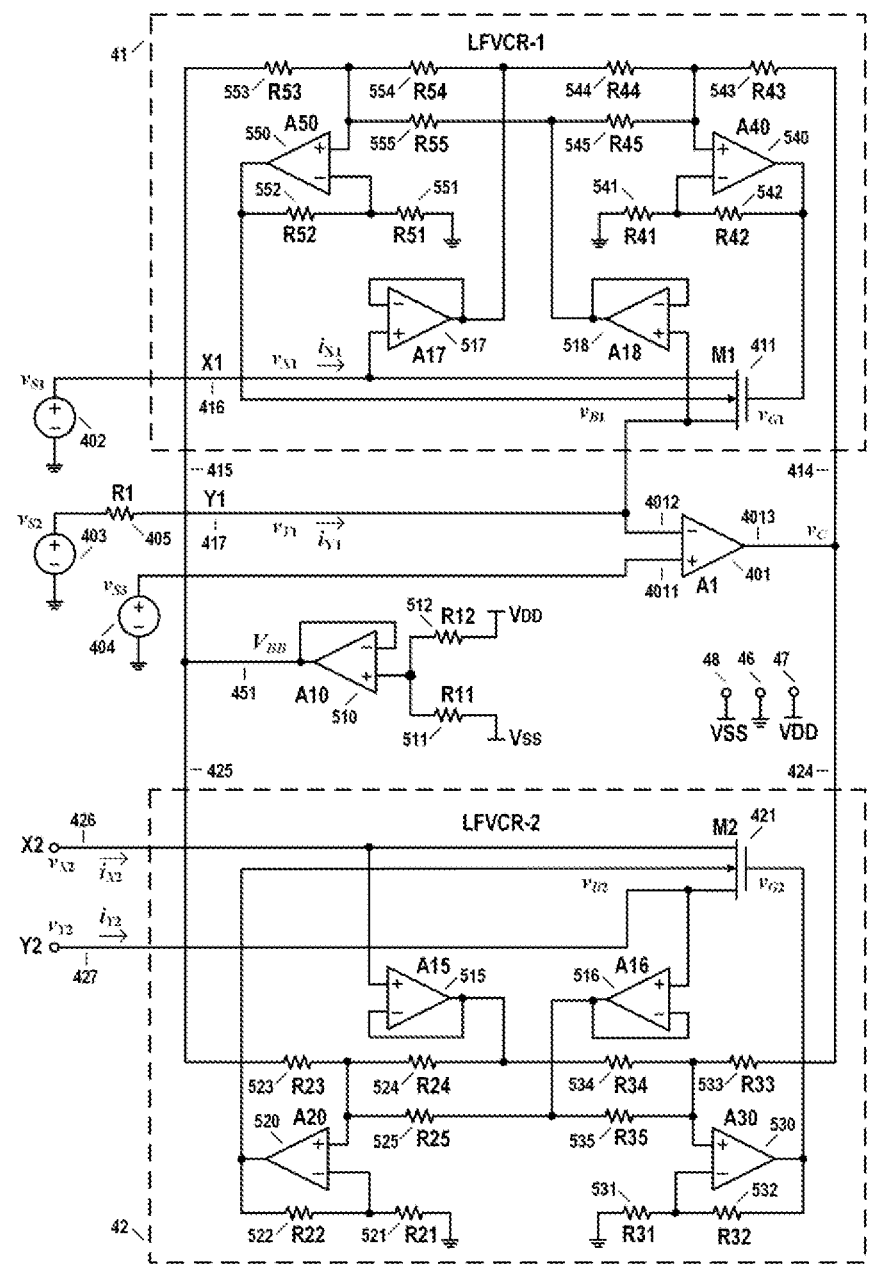
FIG. 5 illustrates a circuit of the precision and linear floating resistor of FIG. 4 with the gate and substrate drives realized using resistors and op amps, in accordance with the present disclosure.

The schematic of the precision and linear floating resistor shown in FIG. 4 can be realized by using resistors and op amps for the addition operation in the gate drive means and the substrate drive means. FIG. 5 illustrates one such realization, in accordance with the present disclosure. The circuit in FIG. 5 comprises a ground terminal (46), two supply voltage terminals (47, 48), two MOSFET devices (411, 421), 10 op amps (401, 510, 515, 516, 517, 518, 520, 530, 540, 550), 23 resistors (405, 511, 512, 521, 522, 523, 524, 525, 531, 532, 533, 534, 535, 541, 542, 543, 544, 545, 551, 552, 553, 554, 555), and three voltage sources (402, 403, 404). The bias voltage means 45 of FIG. 4 is realized using the op amp 510 (A10) and the resistors 511 (R11) and 512 (R12). The resistor 511 is connected between the lower supply voltage terminal 48 (VSS) and the noninverting input of the op amp 510. The resistor 512 is connected between the higher supply voltage terminal 47 (VDD) and the noninverting input of the op amp 510. The inverting input of the op amp 510 is connected to its output, providing the voltage $V_{BB}$ at terminal 451. The op amps 515 and 516 (A15 and A16) are used as unity gain buffers by connecting their noninverting inputs to the resistor terminals 426 and 427, respectively, and connecting their inverting input terminals to their respective output terminals, buffering the voltages $v_{X2}$ and $v_{Y2}$, respectively. Similarly, the op amps 517 and 518 (A17 and A18) are used as unity gain buffers to provide buffered voltages $v_{S1}$ and $v_{S3}$, respectively.

In the circuit of FIG. 5, the gate drive means 412 for the MOSFET 411 comprises the op amp 540 (A40) and the resistors 541 (R41), 542 (R42), 543 (R43), 544 (R44), and 545 (R45) and the substrate drive means 413 for this MOSFET comprises the op amp 550 (A50) and the resistors 551 (R51), 552 (R52), 553 (R53), 554 (R54), and 555 (R55). The gate drive means 422 for the MOSFET 421 comprises the op amp 530 (A30) and the resistors 531 (R31), 532 (R32), 533 (R33), 534 (R34), and 535 (R35) and the substrate drive means 423 for this MOSFET comprises the op amp 520 (A20) and the resistors 521 (R21), 522 (R22), 523 (R23), 524 (R24), and 525 (R25).

In the circuit of FIG. 5, the gate and substrate drive means for the MOSFET M1 provide the outputs in accordance with Equations 17 and 18 and those for the MOSFET M2 provide the outputs in accordance with Equations 19 and 20. The output $v_{B2}$ of the op amp A20 is given as $$v_{B2} = (1 + R_{22}/R_{21})[V_{BB}(R_{24}\|R_{25})/(R_{23} + R_{24}\|R_{25}) + v_X(R_{23}\|R_{25})/(R_{24} + R_{23}\|R_{25}) + v_Y(R_{23}\|R_{24})/(R_{25} + R_{23}\|R_{24})] \quad (32)$$

To get the relation in Equation 32 the same as that in Equation 20, the resistor values are selected as the following:

$$R_{21} = R_{22}, R_{24} = R_{25} = 2R_{23}$$

Similarly, the resistor values for the gate drive means for the MOSFET M2 and those for the gate drive means and the substrate drive means for the device M1 are selected as the following:

$$R_{31}=R_{32}, R_{34}=R_{35}=2R_{33}$$

$$R_{41}=R_{42}, R_{44}=R_{45}=2R_{43}$$

$$R_{51}=R_{52}, R_{54}=R_{55}=2R_{53}$$

The values of the resistors R11 and R12 are selected to provide the desired voltage $V_{BB}$ at the output of the bias voltage means as $$V_{BB}=V_{DD}[R_{11}/(R_{11}+R_{12})]+V_{SS}[R_{12}/(R_{11}+R_{12})] \quad (33)$$

This voltage is bounded by $V_{DD}$ and $V_{SS}$. To maximize the differential voltage swing as given by Equation 16, $V_{BB}$ should be as low as feasible subject to the condition that the corresponding voltages $v_{B1}$ and $v_{B2}$ as given by Equations 18 and 20, respectively, are well within the output voltage swing of the op amps.

The circuit of FIG. 5 has been given to illustrate a possible realization of the precision and linear floating resistor as schematically shown in FIG. 4. Several variants of this realization are possible. The unity gain buffers using the op amps A15 and A16 are not needed if the variable resistance $R_{X2Y2}$ is much smaller than the resistances $R_{24}$, $R_{25}$, $R_{34}$, and $R_{35}$. If one end of the variable resistance $R_{X2Y2}$ is ground or virtual ground, the unity gain buffer at the corresponding end (the buffer using the op amp A15 or A16) is not needed. The unity gain buffers using the op amps A17 and A18 are not needed if the variable resistance $R_{X2Y2}$ is much smaller than the resistances $R_{44}$, $R_{45}$, $R_{54}$, and $R_{55}$. There are several other possible adder circuits for realizing the relations as given in Equations 17, 18, 19, and 20 using resistors and op amps or other devices. The bias voltage means can be realized by using several other op-amp based circuits or by using a voltage reference. Therefore, those well versed in the art of electronic circuit design can work out several other realizations of the precision and linear floating resistor as schematically shown in FIG. 4 and in accordance with the preferred embodiment of the present disclosure.

Figure 6:
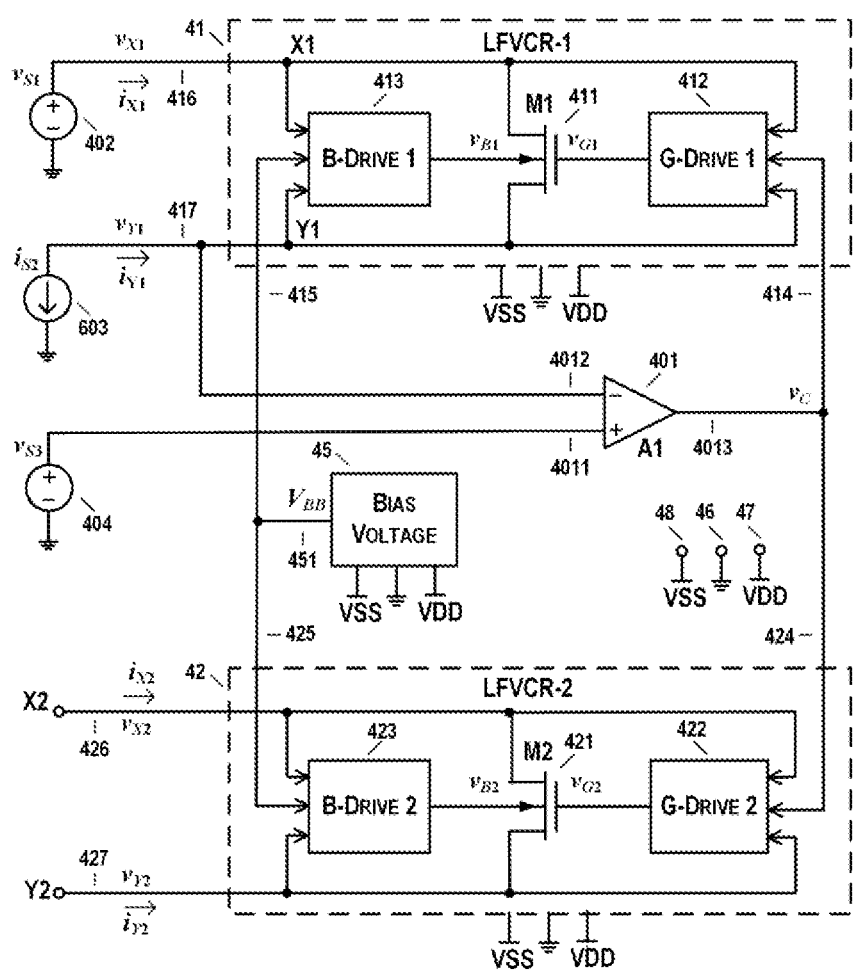
FIG. 6 illustrates a schematic of the precision and linear floating resistor circuit, with the resistance controlled by a combination of two voltages and a current, in accordance with another embodiment of the present disclosure.

FIG. 6 illustrates a schematic of the precision and linear floating resistor circuit using a matched pair of n-channel MOSFET devices and the resistance controlled by a combination of two voltages and a current, in accordance with another embodiment of the present disclosure. The circuit in FIG. 6 is obtained by replacing the second voltage source 403 ($v_{S2}$) and the series resistor 405 (R1) in the circuit of FIG. 4 by a current source 603 ($i_{S2}$). In this circuit, $i_{Y1}=-i_{S2}$ and the resistance across the resistor terminals 426 and 427 is given as $$R_{X2Y2}=(v_{S1}-v_{S3})/i_{S2} \quad (34)$$

With $v_{S3}=0$, the resistance is given as $$R_{X2Y2}=v_{S1}/i_{S2} \quad (35)$$

This embodiment is particularly suited for applications using current-mode circuits. Realization of the circuit of FIG. 6 using op amps is very similar to that illustrated in FIG. 5.

Figure 7:
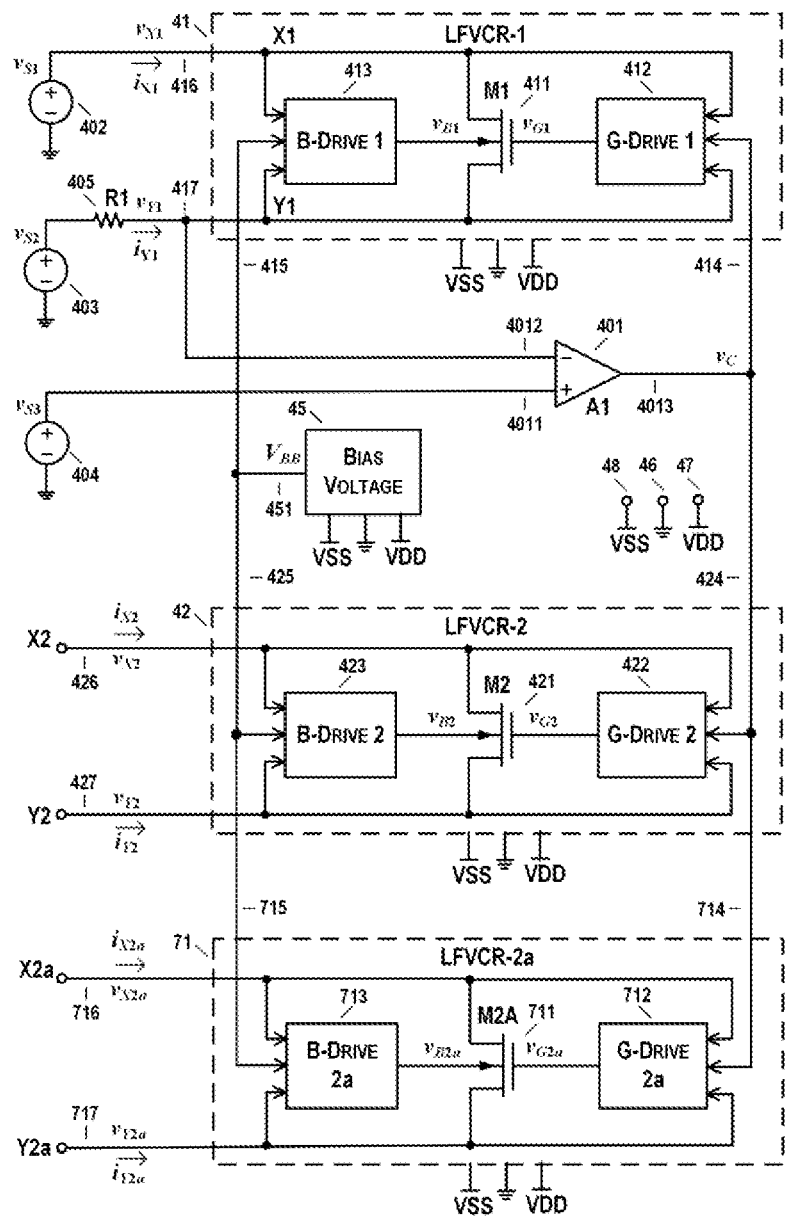
FIG. 7 illustrates a schematic of a resistor mirror circuit having two variable resistors with independent terminals, in accordance with another embodiment of the present disclosure.

A resistor whose resistance tracks the resistance of another resistor is known as a resistor mirror. A resistor mirror circuit with two or more resistors is useful for analog signal processing, particularly for tuning. A resistor mirror circuit having two variable resistors with independent terminals is illustrated in FIG. 7, in accordance with another embodiment of the present disclosure. The resistor mirror circuit is an extension of the precision and linear floating resistor of FIG. 4. The resistor mirror circuit comprises three LFVCR circuits (41, 42, 71), a bias voltage means (45), a ground terminal (46), two supply voltage terminals (47, 48), an op amp (401), three voltage sources (402, 403, 404), and a resistor (405). The resistor mirror circuit uses three matched n-channel MOSFET devices (411, 421, 711) with corresponding gate and substrate drive means as explained earlier in the context of the circuit shown in FIG. 4. The LFVCR circuit 41 (LFVCR-1) using the MOSFET 411 (M1) and the LFVCR circuit 42 (LFVCR-2) using the MOSFET 421 (M2) are the same as described in FIG. 4. The third LFVCR circuit 71 (LFVCR-2a) comprises a MOSFET (711), a control terminal (714), a bias terminal (715), two resistor terminals (716, 717), a gate drive means (712), and a substrate drive means (713). The control terminal 714 and the bias terminal 715 are connected to the control and bias terminals of the LFVCR circuit 42. As the MOSFET devices are matched, the circuit LFVCR-2a provides the same resistance across the terminals 716 (X2a) and 717 (Y2a) as provided by the circuit LFVCR-2 across the terminals 426 (X2) and 427 (Y2). Thus, the circuit realizes a resistor mirror with resistors across two independent sets of terminals, with $R_{X2aY2a}=R_{X2Y2}$. By including more LFVCR circuits, the resistance mirror circuit can provide multiple tracking resistors. For N resistors, the circuit needs N+1 matched devices with independent substrates. The circuit shown in FIG. 7 can be modified for current control as in FIG. 6. All these variant embodiments of the present disclosure can be realized either using op amps and resistors in a manner similar to that in the circuit of FIG. 5 or using other devices.

The precision and linear floating resistor illustrated in FIG. 4, realization of the same in FIG. 5, and the resistor mirror circuit in FIG. 7 are given using matched n-channel MOSFET devices and applying voltages such that $v_{S1}>v_{S3}>v_{S2}$ and $V_{BB}<v_{S3}$. Similar embodiments can be given using a pair of matched p-channel MOSFET devices and applying voltages such that $v_{S1}<v_{S3}<v_{S2}$ and $V_{BB}>v_{S3}$.

Figure 8:
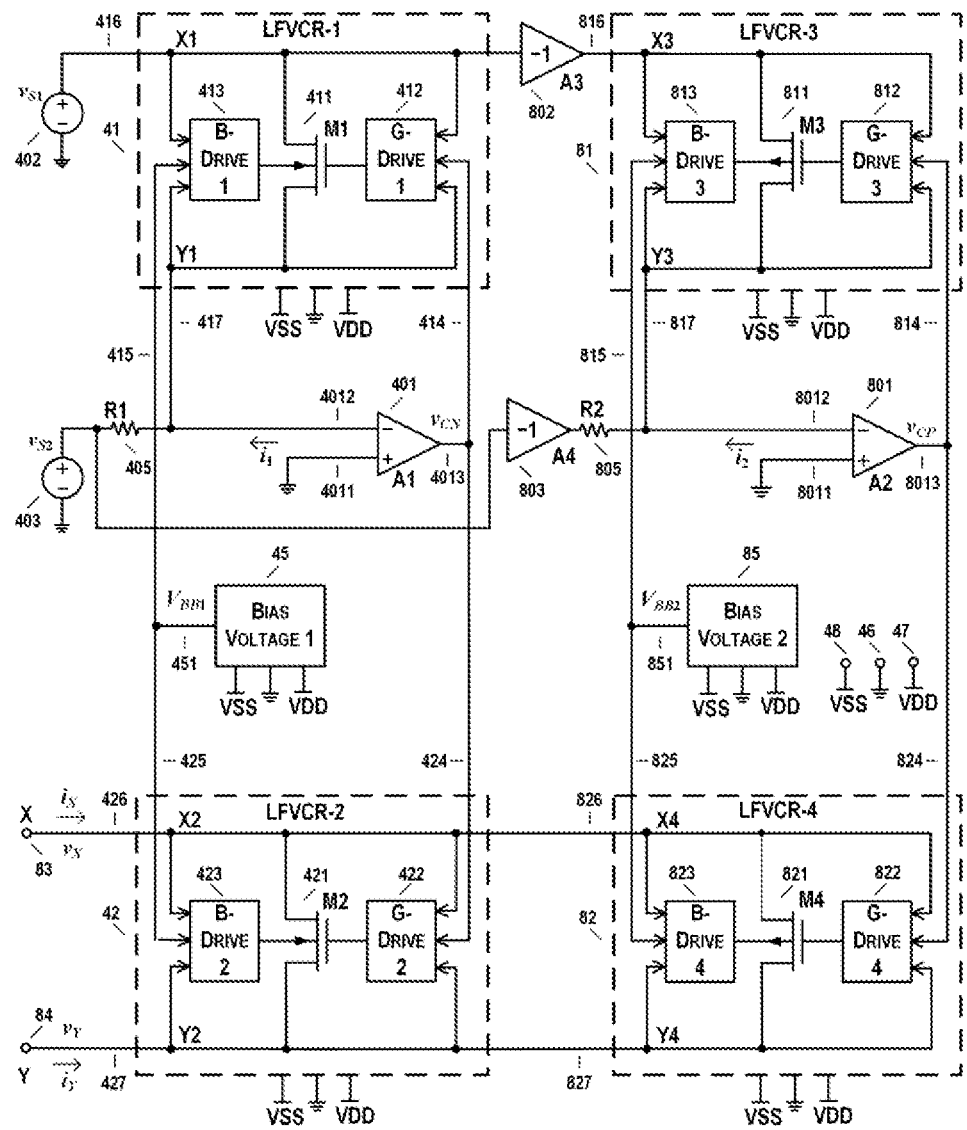
FIG. 8 illustrates a schematic of the resistor circuit using a matched pair of n-channel MOSFET devices and a matched pair of p-channel MOSFET devices, in accordance with another embodiment of the present disclosure.

One of the main contributors to nonlinearity of the resistance of the circuits of FIG. 3 and FIG. 4 is a deviation from the assumption of strong channel inversion. In case of a parallel connection of the source-drain terminals of an n-channel MOSFET and a p-channel MOSFET, the effects of change in the terminal voltage on the channel inversion of the two devices are complementary in nature. Therefore, embodiments using n-channel MOSFET devices and p-channel MOSFET devices can be combined to improve the linearity of the resistor. FIG. 8 illustrates such an embodiment of the present disclosure, using a matched pair of n-channel MOSFET devices and a matched pair of p-channel MOSFET devices and with the voltage source $v_{S3}$ replaced by the ground. The circuit of FIG. 8 comprises a ground terminal (46), two supply voltage terminals (47, 48), two resistor terminals (83, 84), and two precision and linear floating resistors. The first precision and linear floating resistor comprises two LFVCR circuits (41, 42) using matched n-channel MOSFET devices (411, 421), a first op amp (401), two voltage sources (402, 403), a first resistor (405), a first bias voltage means (45), and two resistor terminals (426, 427). The second precision and linear floating resistor comprises two LFVCR circuits (81, 82) using matched p-channel MOSFET devices (811, 821), a second op amp (801), two inverting unity gain amplifiers (802, 803), a second resistor (805), a second bias voltage means (85), and two resistor terminals (826, 827).

In the circuit shown in FIG. 8, the first LFVCR circuit 41 (LFVCR-1) comprises the n-channel MOSFET 411 (M1), a gate drive means (412), a substrate drive means (413), a control terminal (414), a bias terminal (415), and two resistor terminals (416, 417). The second LFVCR circuit 42 (LFVCR-2) comprises the n-channel MOSFET 421 (M2), a gate drive means (422), a substrate drive means (423), a control terminal (424), a bias terminal (425), two resistor terminals (426, 427). The first op amp 401 (A1), the first bias voltage means 45 (Bias Voltage 1), and the first resistor 405 (R1) are connected as in FIG. 4, forming the first precision and linear floating resistor circuit to provide a floating resistance across the resistor terminals 426 and 427 of the second LFVCR circuit 42. The third LFVCR circuit 81 (LFVCR-3) comprises the p-channel MOSFET 811 (M3), a gate drive means (812), a substrate drive means (813), a control terminal (814), a bias terminal (815), and two resistor terminals (816, 817). Similarly, the fourth LFVCR circuit 82 (LFVCR-4) comprises the p-channel MOSFET 821 (M4), a gate drive means (822), a substrate drive means (823), a control terminal (824), a bias terminal (825), and two resistor terminals (826, 827). The second op amp 801 (A2), the second bias voltage means 85 (Bias Voltage 2), and the second resistor 805 (R2) are connected to provide a floating resistance across the resistor terminals 826 and 827 of the fourth LFVCR circuit 82. The first voltage source 402 ($v_{S1}$) is connected to the input of the first inverting unity gain amplifier 802 (A3). The output of the first inverting unity gain amplifier 802 is connected to the first resistor terminal 816 (X3) of the third LFVCR circuit 81. The second voltage source 403 ($v_{S2}$) is connected to the input of the second inverting unity gain amplifier 803 (A4). The output of the second inverting unity gain amplifier 803 is connected in series with the second resistor 805 to the second resistor terminal 817 (Y3) of the third LFVCR circuit 81 and to the inverting input terminal of the second op amp 801. The op amps, the gate drive means, and the substrate drive means are powered by connections to the power supply and ground terminals. The power connections are not shown in the figure.

The resistor terminals 426 (X2) and 427 (Y2) of the LFVCR circuit 42 and the resistor terminals 826 (X4) and 827 (Y4) of the LFVCR circuit 82 are connected in parallel to provide the resistor terminals 83 (X) and 84 (Y). The output of the op amp A1 ($v_{CN}$) provides the control voltage to LFVCR-1 and LFVCR-2. The output of the op amp A2 ($v_{CP}$) provides the control voltage to LFVCR-3 and LFVCR-4. There are two bias voltages in this circuit. The voltage $V_{BB1}$ at the output 451 of the bias voltage means 45 provides the bias voltage for LFVCR-1 and LFVCR-2. The voltage $V_{BB2}$ at the output 851 of the bias voltage means 85 provides the bias voltage for LFVCR-3 and LFVCR-4. The voltage sources $v_{S1}$ and $v_{S2}$ are applied as the control voltages for the variable resistance provided by the MOSFET M2. The voltages $v_{S1}$ and $v_{S2}$ are input to the inverting unity gain amplifiers A3 and A4, respectively, and the resulting outputs are applied as the control inputs for the variable resistance provided by the device M4. The resistance across the X and Y terminals of FIG. 8 is given as $$R_{XY}=[v_{S1}/(-v_{S2})]R_1\|[(-v_{S1})/(v_{S2})]R_2 \qquad (36)$$

With the resistor values selected as R2=R1 for linearity improvement, the resistance $R_{XY}$ is given as $$R_{XY}=[v_{S1}/(-v_{S2})]R_1/2 \qquad (37)$$

The circuit of FIG. 8 can be modified to get a resistor circuit wherein the resistance is controlled by a variable current, in a manner similar to the modification of the resistor circuit of FIG. 4 to the resistor circuit of FIG. 6. The circuit of FIG. 8 can also be used for realizing a resistor mirror in a manner similar to the circuit of FIG. 7. The circuit schematic shown in FIG. 8 can be realized using op amps in a manner similar to that illustrated in FIG. 5.

Figure 9:
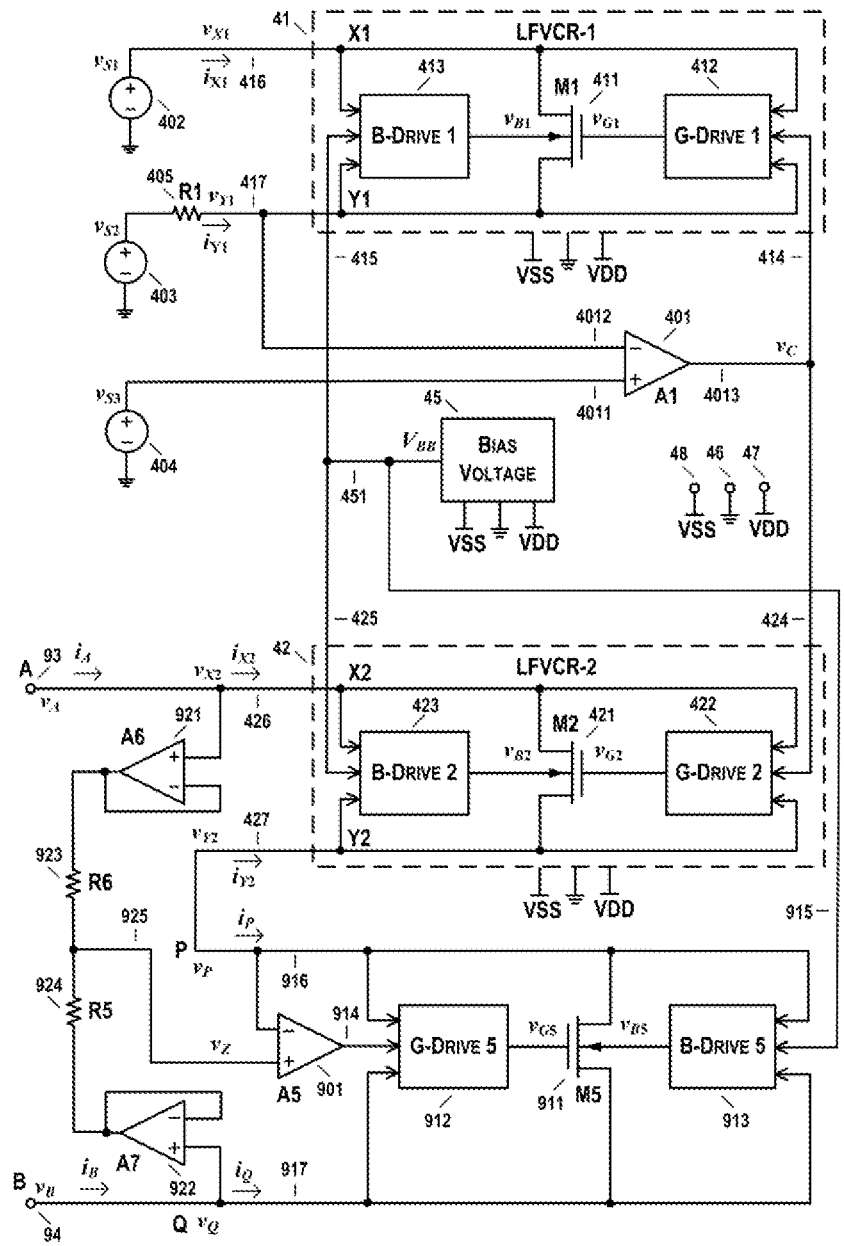
FIG. 9 illustrates a schematic of a circuit for realizing a precision and linear floating resistor with scaled-up resistance and extended voltage range, in accordance with another embodiment of the present disclosure.

Some applications may require a precision and linear floating resistor with a voltage range of operation that is much larger than that provided by the embodiment using a matched pair of devices as illustrated in FIG. 4. Referring to FIG. 9, illustrated is a schematic of a circuit for realizing a precision and linear floating resistor having a scaled-up resistance and an extended voltage range, in accordance with another embodiment of the present disclosure. The circuit of FIG. 9 comprises two LFVCR circuits (41, 42), a bias voltage means (45), an op amp (401), three voltage sources (402, 403, 404), a resistor (405), a ground terminal (46), and two supply voltage terminals (47, 48), similar to as in the circuit illustrated in FIG. 4. The circuit of FIG. 9 further comprises a resistance scaling circuit with two resistor terminals (93, 94) connected to the LFVCR circuit 42. The resistance scaling circuit comprises a third MOSFET (911), a third gate drive means (912), a third substrate drive means (913), a voltage sensing means with an output terminal (925) for sensing the voltage across the resistor terminals 93 and 94, and a second op amp (901). The noninverting terminal of the second op amp 901 is connected to the output terminal 925 of the voltage sensing means. The voltage sensing means comprises two op amps (921, 922) and two resistors (923, 924) and provides the sensed voltage $v_Z$ at the output terminal 925.

The gate and substrate terminals of the third MOSFET 911 (M5) are connected to the third gate drive means 912 (G-Drive 5) and the third substrate drive means 913 (B-Drive 5), respectively, having input and output connections and functions similar to the gate and substrate drive means described in the context of the circuit in FIG. 4. The first interchangeable source-drain terminals 916 (P) of the third MOSFET 911 is connected to the resistor terminal 427 (Y2) of LFVCR-2. The first resistor terminals 426 of LFVCR-2 and the second interchangeable source-drain terminal 917 of the MOSFET 911 are connected to the scaled-up resistor terminals 93 (A) and 94 (B), respectively. The op amp 921 is used as a unity follower to buffer the voltage VA and the op amp 922 is used as a unity follower to buffer the voltage $v_B$. The resistors 924 (R5) and 923 (R6) are connected as a voltage divider between the output terminals of the op amps 921 and 922. The common point 925 of the resistors 923 and 924 with the voltage $v_Z$ is connected to the noninverting input of the second op amp 901 (A5). The inverting input of the op amp 901 is connected to the terminal 916. The output terminal 914 of the op amp 901 is connected as input to the gate drive means 912. The output terminal 451 of the bias voltage means 45 provides bias voltage to all the substrate drive means. The LFVCR circuits, the bias voltage means, and the op amps are powered by connections to the ground terminal and the two power supply terminals. The power connections are not shown in FIG. 9.

In the circuit of FIG. 9, the currents in the MOSFET devices 411 and 421 are the same and therefore $i_A=i_{X2}=-i_{Y2}=i_P=-i_Q=-i_B$. The arrangement of the op amps 921 and 922 and the resistors 923 and 924 serves as a voltage sensing means for the voltage across the terminals A and B. The sensed voltage $v_Z$, applied to the noninverting input of the op amp A5, is given as $$v_Z=v_{X2}[R_5/(R_5+R_6)]+v_Q[R_6/(R_5+R_6)] \qquad (38)$$

With the resistance across the P and Q terminal given as $R_{PQ}$ and that across the X2 and Y2 terminals given as $R_{X2Y2}$, the voltage $v_P$ at the inverting terminal of the op amp A5 is given as $$v_P = v_{X2}[R_{PQ}/(R_{PQ}+R_{X2Y2})] + v_Q[R_{X2Y2}/(R_{PQ}+R_{X2Y2})] \quad (39)$$

Due to the negative feedback from the output of the second op amp 901 to its input, its inverting and noninverting terminals are at the same potential, resulting in $v_P = v_Z$. Therefore, we get the following relation from Equations 38 and 39:

$$R_{PQ}/R_{X2Y2} = R_5/R_6 \quad (40)$$

The resistance across the A and B terminals is given as $$R_{AB} = R_{X2Y2} + R_{PQ} \quad (41)$$

Using the relation in Equations 40 and 41, the resistance $R_{AB}$ is given as $$R_{AB} = R_{X2Y2}(1 + R_5/R_6) \quad (42)$$

Using the expression for $R_{X2Y2}$ as given in Equation 28, the resistance $R_{AB}$ is given as $$R_{AB} = [(v_{S1}-v_{S3})/(v_{S3}-v_{S2})]R_1(1+R_5/R_6) \quad (43)$$

Thus, the circuit shown in FIG. 9 serves as a precision and linear floating resistance and it can be used for scaling-up the variable resistance and extending the voltage range.

The circuit shown in FIG. 9 provides a scaled-up resistance that can be controlled by a combination of three voltage sources (402, 403, 404) and a resistor (405). The three MOSFET devices 411, 421, and 911 have independent substrates. The MOSFET devices 411 and 421 are matched and should preferably be on the same chip. The third MOSFET 911 provides the scaled-up resistance and voltage range as required by the application. The third MOSFET 911 need not be matched and need not be on the same chip. Therefore, the third MOSFET 911 can be selected for a higher channel resistance and extended voltage range as compared to the matched pair of MOSFET devices. In a variant of the circuit, the bias voltage means for the third MOSFET 911 may be different from that for the MOSFET devices 411 and 421. In order to increase the swing across the scaled-up resistance, the op amps used in the resistance scaling circuit may be powered by power supplies that are different from the ones used for rest of the circuit.

Figure 10:
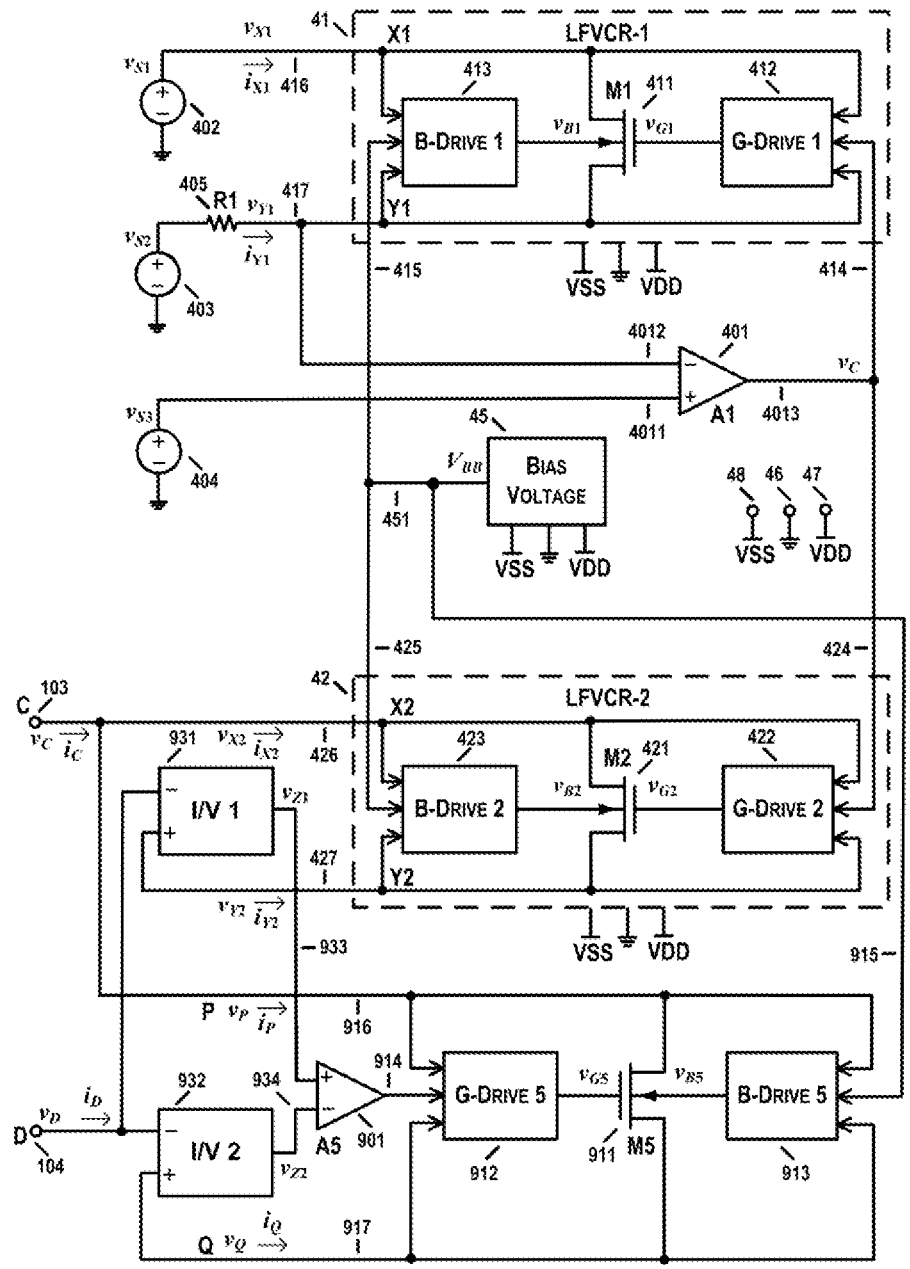
FIG. 10 illustrates a schematic of a circuit for realizing a precision and linear floating resistor with scaled-down resistance and extended current range, in accordance with another embodiment of the present disclosure.

Some applications may require a precision and linear floating resistor with a current range of operation that is much larger than that provided by the embodiment using a matched pair of devices as illustrated in FIG. 4. Referring to FIG. 10, illustrated is a schematic of a circuit for realizing a precision and linear floating resistor having a scaled-down resistance and an extended current range, in accordance with another embodiment of the present disclosure. The circuit of FIG. 10 has a configuration similar to that of the circuit of FIG. 9, with the voltage sensing means of the resistance scaling circuit replaced by a current sensing means. The current sensing means comprises two current-to-voltage converters (931, 932) with a first sensing output terminal (933) providing a first sensed voltage ($v_{Z1}$) proportional to the current through the MOSFET 421 (M2) and a second sensing output terminal (934) providing a second sensed voltage ($v_{Z2}$) proportional to the current through the MOSFET 911. The gate and substrate terminals of the MOSFET 911 (M5) are connected to the gate drive means 912 (G-Drive 5) and the substrate drive means 913 (B-Drive 5) having input and output connections and functions similar to the gate and drive means described in the context of the circuit in FIG. 4. The sensing output terminals 933 and 934 are connected to the noninverting and inverting inputs, respectively, of the second op amp 901 (A5). The output terminal 914 of the second op amp 901 is connected as input to the gate drive means 912 of the MOSFET 911. The output terminal 451 of the bias voltage means 45 provides bias voltage to all the substrate drive means. The interchangeable source-drain terminals 916 (P) and 917 (Q) of the MOSFET 911 are connected in parallel to the resistor terminals 426 (X2) and 427 (Y2) of the LFVCR-2, respectively and are connected to the scaled-down resistor terminals 103 (C) and 104 (D), respectively.

In the circuit of FIG. 10, the current flowing from the resistor terminal C to the resistor terminal D is the sum of the currents of the MOSFET M2 and the MOSFET M5. Therefore, $i_C = -i_D = i_{X2} + i_P = -i_{Y2} - i_Q$. The resistance across the terminals X2 and Y2 is $R_{X2Y2}$ and the resistance across the terminals P and Q is $R_{PQ}$. Therefore, the resistance across the terminals C and D is given as $$R_{CD} = R_{X2Y2} \| R_{PQ} \quad (44)$$

The arrangement of the current-to-voltage converters 931 (I/V 1) and 932 (I/V 2) serves as a current sensing means for the currents in the MOSFET M2 and the MOSFET M5. The current-to-voltage converter 931 converts its input current $i_{Y2}$ to the first sensed voltage $v_{Z1}$ as $$v_{Z1} = -r_1 i_{Y2} \quad (45)$$

and the current-to-voltage converter 932 converts its input current $i_Q$ to the second sensed voltage $v_{Z2}$ as $$v_{Z2} = -r_2 i_Q \quad (46)$$

where $r_1$ and $r_2$ are the trans-resistances of the current-to-voltage converters 931 and 932, respectively. Due to a negative feedback from the output of the op amp A5 to its input, its inverting and noninverting terminals are at the same potential, resulting in $v_{Z1} = v_{Z2}$. Therefore, we get the following relation from Equations 45 and 46:

$$i_{Y2}/i_Q = r_2/r_1 \quad (47)$$

Since $i_{Y2} = V_{CD}/R_{X2Y2}$ and $i_Q = v_{CD}/R_{PQ}$, we get $$R_{PQ}/R_{X2Y2} = r_2/r_1 \quad (48)$$

From Equations 44 and 48, the resistance across the C and D terminals is given as $$R_{CD} = R_{X2Y2}/(1 + r_1/r_2) \quad (49)$$

Using the expression as given in Equation 28, the resistance $R_{CD}$ is given as $$R_{CD} = [(v_{C1}-v_{C3})/(v_{C3}-v_{C2})]R_1/(1+r_1/r_2) \quad (50)$$

Thus, the circuit shown in FIG. 10 serves as a precision and linear floating resistance and it can be used for scaling-down the variable resistance and extending the current range.

In the circuit of FIG. 10, the third MOSFET 911 provides the scaled-down resistance as required by the application. The resistance across the circuit terminals 103 and 104 can be controlled by a combination of the three voltage sources (402, 403, 404) and the resistor (405). The third MOSFET 911 can be selected for a lower resistance and extended current range as compared to the matched pair of MOSFET devices 411 and 421. The three MOSFET devices have independent substrates. The MOSFET devices M1 and M2 are matched and they should preferably be on the same chip. The MOSFET M5 need not be matched to M1 and M2 and it need not be on the same chip. Therefore, its channel resistance and operating current are not restricted by the CMOS process used for matched transistors with independent substrates.

The above description along with the accompanying drawings is intended to disclose and describe the preferred embodiments of the invention in sufficient detail to enable those skilled in the art to practice the invention. It should not be interpreted as limiting the scope of the invention. Those skilled in the art to which the invention relates will appreciate that many variations of the exemplary implementations and other implementations exist within the scope of the claimed invention. Various changes in form and detail may be made therein without departing from its spirit and scope. Similarly, various aspects of the present invention may be advantageously practiced by incorporating all features or certain sub-combinations of the features.

We claim:

1. A circuit for realizing a continuously variable precision and linear floating resistor, comprising:
   (i) at least two linear floating voltage-controlled resistor (LFVCR) circuits comprising a first LFVCR circuit and a second LFVCR circuit, wherein each LFVCR circuit comprises (a) two resistor terminals, a control terminal, and a bias terminal; (b) a MOSFET having two interchangeable source-drain terminals, a gate terminal, and a substrate terminal; (c) a gate drive means having three inputs, with interchangeable source-drain terminals of the MOSFET connected as the two inputs and the control terminal connected as the third input, and an output connected to the gate terminal of the MOSFET; and (d) a substrate drive means having three inputs, with the interchangeable source-drain terminals of the MOSFET connected as the two inputs and the bias terminal connected as the third input, and an output connected to the substrate terminal of the MOSFET;
   (ii) a bias voltage means with an output terminal connected to the bias terminal of each LFVCR circuit for providing a bias voltage ($V_{BB}$);
   (iii) an op amp having noninverting and inverting input terminals, and an output terminal connected to the control terminal of each LFVCR circuit for providing a control voltage ($v_C$); and
   (iv) three voltage sources comprising a first voltage source, a second voltage source, and a third voltage source, and a resistor;
   wherein the MOSFET devices of the LFVCR circuits are matched and have independent substrate terminals, the first voltage source is connected to the first resistor terminal of the first LFVCR circuit, the second voltage source is connected in series with the resistor to the second resistor terminal of the first LFVCR circuit and to the inverting input terminal of the op amp, the third voltage source is connected to the noninverting input terminal of the op amp, and the resistor terminals of the second LFVCR circuit serve as the resistor terminals of the circuit.

2. The circuit as claimed in claim 1, wherein the gate drive means and the substrate drive means are adder circuits receiving three inputs and generating an output by adding the average of the first input and the second input to the third input.

3. The circuit as claimed in claim 1, wherein the first LFVCR circuit and the op amp form a negative feedback loop to compensate the resistance of the circuit against the device parameter variations, thereby resulting in a precision resistor.

4. The circuit as claimed in claim 1, wherein the resistance across the resistor terminals of the second LFVCR circuit tracks the resistance across the resistor terminals of the first LFVCR circuit.

5. The circuit as claimed in claim 1, wherein the resistance across the resistor terminals of the circuit is continuously variable using a combination of three voltage sources and a resistor.

6. The circuit as claimed in claim 1, wherein the resistance across the resistor terminals is directly proportional to the difference of the voltages of the first voltage source and the third voltage source; inversely proportional to the difference of the voltages of the third voltage source and the second voltage source, and directly proportional to the resistance of the resistor.

7. The circuit as claimed in claim 1, wherein the third voltage source can be set as zero by connecting the noninverting input of the op amp to the ground terminal.

8. The circuit as claimed in claim 1, wherein the circuit is realized as part of an integrated circuit using a CMOS process permitting MOSFET devices having independent substrates.

9. The circuit as claimed in claim 1, wherein the gate drive means of each LFVCR circuit comprises at least one op amp and at least five resistors interconnected as an adder circuit to generate an output by adding the average of the first input and the second input to the third input.

10. The circuit as claimed in claim 1, wherein the substrate drive means of each LFVCR circuit comprises at least one op amp and at least five resistors interconnected as an adder circuit to generate an output by adding the average of the first input and the second input to the third input.

11. The circuit as claimed in claim 1, wherein the bias voltage means comprises an op amp and at least two resistors to generate a buffered dc voltage as the bias voltage ($V_{BB}$).

12. The circuit as claimed in claim 1, wherein the resistance across the resistor terminals of the circuit is controlled by the first voltage source and the third voltage source, and optionally by a current source connected to the second resistor terminal of the first LFVCR circuit.

13. The circuit as claimed in claim 1, wherein the MOSFET devices are n-channel devices.

14. The circuit as claimed in claim 1, wherein the MOSFET devices are p-channel devices.

15. The circuit as claimed in claim 1 further comprising a third LFVCR circuit, wherein the bias terminal and the control terminal of the third LFVCR circuit are connected to the corresponding terminals of the second LFVCR circuit and the resistance across the terminals of the third LFVCR circuit tracks the resistance across the terminals of the second LFVCR circuit, thereby realizing a resistor mirror with independent resistor terminals.

16. A circuit for realizing a continuously variable precision and linear floating resistor, comprising:
   (i) a first pair of linear floating voltage-controlled resistor (LFVCR) circuits comprising a first LFVCR circuit and a second LFVCR circuit, and a second pair of LFVCR circuits comprising a third LFVCR circuit and a fourth LFVCR circuit, wherein each LFVCR circuit comprises (a) two resistor terminals, a control terminal, a bias terminal; (b) a MOSFET; (c) a gate drive means having three inputs, with the interchangeable source-drain terminals of the MOSFET connected as the two inputs and the control terminal connected as the third input, and an output connected to the gate terminal of the MOSFET; and (d) a substrate drive means having three inputs, with the interchangeable source-drain terminals of the MOSFET connected as the two inputs and the bias terminal connected as the third input, and an output connected to the substrate terminal of the MOSFET;

(ii) at least two bias voltage means comprising a first bias voltage means with an output terminal connected to the bias terminals of the first pair of LFVCR circuits for providing a first bias voltage ($V_{BB1}$), and a second bias voltage means with an output terminal connected to the bias terminals of the second pair of LFVCR circuits for providing a second bias voltage ($V_{BB2}$);

(iii) at least two op amps comprising a first op amp having noninverting and inverting input terminals and an output terminal connected to the control terminals of the first pair of LFVCR circuits for providing a first control voltage ($v_{CN}$) and a second op amp having noninverting and inverting input terminals and an output terminal connected to the control terminals of the second pair of LFVCR circuits for providing a second control voltage ($v_{CP}$);

(iv) at least two voltage sources comprising a first voltage source and a second voltage source, two resistors comprising a first resistor and a second resistor, and at least two inverting unity gain amplifiers comprising a first inverting unity gain amplifier and a second inverting unity gain amplifier;

wherein a combination of the first pair of LFVCR circuits with n-channel matched MOSFET devices having independent substrate terminals and the second pair of LFVCR circuits with p-channel matched MOSFET devices having independent substrate terminals are used to improve the linearity of the circuit, the noninverting input terminals of the first op amp and the second op amp are connected to the ground, the first voltage source is connected to the first resistor terminal of the first LFVCR circuit, the second voltage source is connected in series with the first resistor to the second resistor terminal of the first LFVCR circuit and to the inverting input terminal of the first op amp, the first voltage source is connected to the input of the first inverting unity gain amplifier, the output of the first inverting unity gain amplifier is connected to the first resistor terminal of the third LFVCR circuit, the second voltage source is connected to the input of the second inverting unity gain amplifier, the output of the second inverting unity gain inverting amplifier is connected in series with the second resistor to the second resistor terminal of the third LFVCR circuit and to the inverting input terminal of the second op amp, and the resistor terminals of the second LFVCR circuit and the resistor terminals of the fourth LFVCR circuit are connected in parallel to serve as the resistor terminals of the circuit.

17. A circuit for realizing a continuously variable precision and linear floating resistor, comprising:
(i) two linear floating voltage-controlled resistor (LFVCR) circuits comprising a first LFVCR circuit and a second LFVCR circuit, wherein each LFVCR circuit comprises (a) two resistor terminals, a control terminal, and a bias terminal; (b) a MOSFET; (c) a gate drive means having three inputs, with the interchangeable source-drain terminals of the MOSFET connected as the two inputs and the control terminal connected as the third input, and an output connected to the gate terminal of the MOSFET; and (d) a substrate drive means having three inputs, with the interchangeable source-drain terminals of the MOSFET connected as the two inputs and the bias terminal connected as the third input, and an output connected to the substrate terminal of the MOSFET;

(ii) a bias voltage means with an output terminal connected to the bias terminal of each LFVCR circuit for providing a bias voltage ($V_{BB}$);

(iii) a first op amp having noninverting and inverting input terminals, and an output terminal connected to the control terminal of each LFVCR circuit for providing a control voltage ($v_C$);

(iv) three voltage sources comprising a first voltage source, a second voltage source and a third voltage source, and a first resistor; and (v) a resistance scaling circuit with two resistor terminals, wherein the resistance scaling circuit comprises
(a) a third MOSFET having interchangeable source-drain terminals;
(b) a third gate drive means having three inputs, with the first two inputs connected to the interchangeable source-drain terminals of the third MOSFET, and an output connected to the gate terminal of the third MOSFET;
(c) a third substrate drive means having three inputs with the first two inputs connected to the interchangeable source-drain terminals of the third MOSFET, the third input connected to the output terminal of the bias voltage means, and an output connected to the substrate terminal of the third MOSFET; and
(d) a voltage sensing means with an output terminal (925) for providing a voltage ($v_Z$) proportional to the voltage difference across the resistor terminals, and
(e) a second op amp with a noninverting terminal connected to the output terminal of the voltage sensing means, an inverting terminal connected to the first interchangeable source-drain terminal of the third MOSFET, and an output connected to the third input of the third gate drive means;

wherein the MOSFET devices of the LFVCR circuits are matched and have independent substrate terminals, the first voltage source is connected to the first resistor terminal of the first LFVCR circuit, the second voltage source is connected in series with the first resistor to the second resistor terminal of the first LFVCR circuit and to the inverting input terminal of the first op amp, the third voltage source is connected to the noninverting input terminal of the first op amp, the second resistor terminal of the second LFVCR circuit is connected to the first interchangeable source-drain terminal of the third MOSFET, and the first resistor terminal of the second LFVCR circuit and the second interchangeable source-drain terminal of the third MOSFET are connected to serve as the two resistor terminals of the circuit.

18. The circuit as claimed in claim 17, wherein the circuit realizes a scaled-up resistance that can be controlled by a combination of three voltage sources and a resistor and the third MOSFET can be selected for a higher resistance and extended voltage range as compared to the matched pair of MOSFET devices.

19. The circuit as claimed in claim 17, wherein the resistance scaling circuit optionally comprises a current sensing means comprising two current-to-voltage converters with a first sensing output terminal providing a first sensed voltage ($v_{Z1}$) proportional to the current through the second MOSFET and a second sensing output terminal providing a second sensed voltage ($v_{Z2}$) proportional to the current through the third MOSFET, the noninverting terminal of the second op amp is connected to the first sensing output terminal of the current sensing means, the inverting terminal of the second op amp is connected to the second sensing output terminal of the current sensing means, the two resistor terminals of the second LFVCR circuit and interchangeable source-drain terminals of the third MOSFET are connected in parallel to serve as the two resistor terminals of the circuit.

20. The circuit as claimed in claim 19, wherein the circuit realizes a scaled-down resistance that can be controlled by the combination of three voltage sources and the first resistor, and the third MOSFET can be selected for a lower resistance and extended current range as compared to the matched pair of MOSFET devices.

* * * * *